(12) United States Patent
Yang et al.

(10) Patent No.: US 11,798,836 B2
(45) Date of Patent: Oct. 24, 2023

(54) SEMICONDUCTOR ISOLATION STRUCTURE AND METHOD OF MAKING THE SAME

(71) Applicant: TAIWAN SEMICONDUCTOR MANUFACTURING COMPANY, LTD., Hsinchu (TW)

(72) Inventors: Tsung-Yu Yang, Hsinchu (TW); Po-Wei Liu, Hsinchu (TW); Yun-Chi Wu, Hsinchu (TW); Yu-Wen Tseng, Hsinchu (TW); Chia-Ta Hsieh, Hsinchu (TW); Ping-Cheng Li, Hsinchu (TW); Tsung-Hua Yang, Hsinchu (TW); Yu-Chun Chang, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 147 days.

(21) Appl. No.: 17/350,930

(22) Filed: Jun. 17, 2021

(65) Prior Publication Data

US 2022/0406652 A1 Dec. 22, 2022

(51) Int. Cl.
*H01L 21/762* (2006.01)
*H01L 21/74* (2006.01)
*H01L 23/535* (2006.01)

(52) U.S. Cl.
CPC ...... *H01L 21/76283* (2013.01); *H01L 21/743* (2013.01); *H01L 23/535* (2013.01)

(58) Field of Classification Search
CPC H01L 21/76283; H01L 21/743; H01L 23/535
See application file for complete search history.

(56) References Cited

U.S. PATENT DOCUMENTS

| | | | |
|---|---|---|---|
| 2005/0095806 A1* | 5/2005 | Nevin | H01L 21/76286 257/E21.549 |
| 2008/0122025 A1* | 5/2008 | Roggenbauer | H01L 27/1203 257/E27.113 |
| 2011/0175205 A1* | 7/2011 | Morii | H01L 27/1203 438/421 |
| 2013/0320459 A1* | 12/2013 | Shue | H01L 21/76283 438/296 |
| 2019/0148219 A1* | 5/2019 | Yen | H01L 27/1218 257/347 |
| 2020/0411360 A1* | 12/2020 | Tokumitsu | H01L 21/76888 |

\* cited by examiner

*Primary Examiner* — Herve-Louis Y Assouman
(74) *Attorney, Agent, or Firm* — Birch, Stewart, Kolasch & Birch, LLP

(57) ABSTRACT

A semiconductor isolation structure includes a silicon-on-insulator wafer, a first deep trench isolation structure and a second deep trench isolation structure. The silicon-on-insulator wafer includes a semiconductor substrate, a buried insulation layer disposed on the semiconductor substrate, and a semiconductor layer disposed on the buried insulation layer. The semiconductor layer has a functional region. The first deep trench isolation structure penetrates the semiconductor layer and the buried insulation layer, and surrounds the functional region. The second deep trench isolation structure penetrates semiconductor layer and the buried insulation layer, and surrounds the first deep trench isolation structure.

20 Claims, 15 Drawing Sheets

SEMICONDUCTOR ISOLATION STRUCTURE AND METHOD OF MAKING THE SAME

BACKGROUND

Nowadays, although electronic devices with low power consumption are rather popular for applications in portable devices, etc., there are also high demands in high power devices, which can be applied in various fields, such as industrial control system, aviation, automobile, etc. Stringent quality standards need to be applied to those fields so as to ensure the safety of the operators or passengers. Therefore, it is desirable to enhance the reliability of high power devices. In addition, with the increasing manufacturing costs associated with the continuous shrinking of semiconductor devices, it is also desirable to manufacture semiconductor devices with improved reliability without significant changes to the currently available manufacturing process flow.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
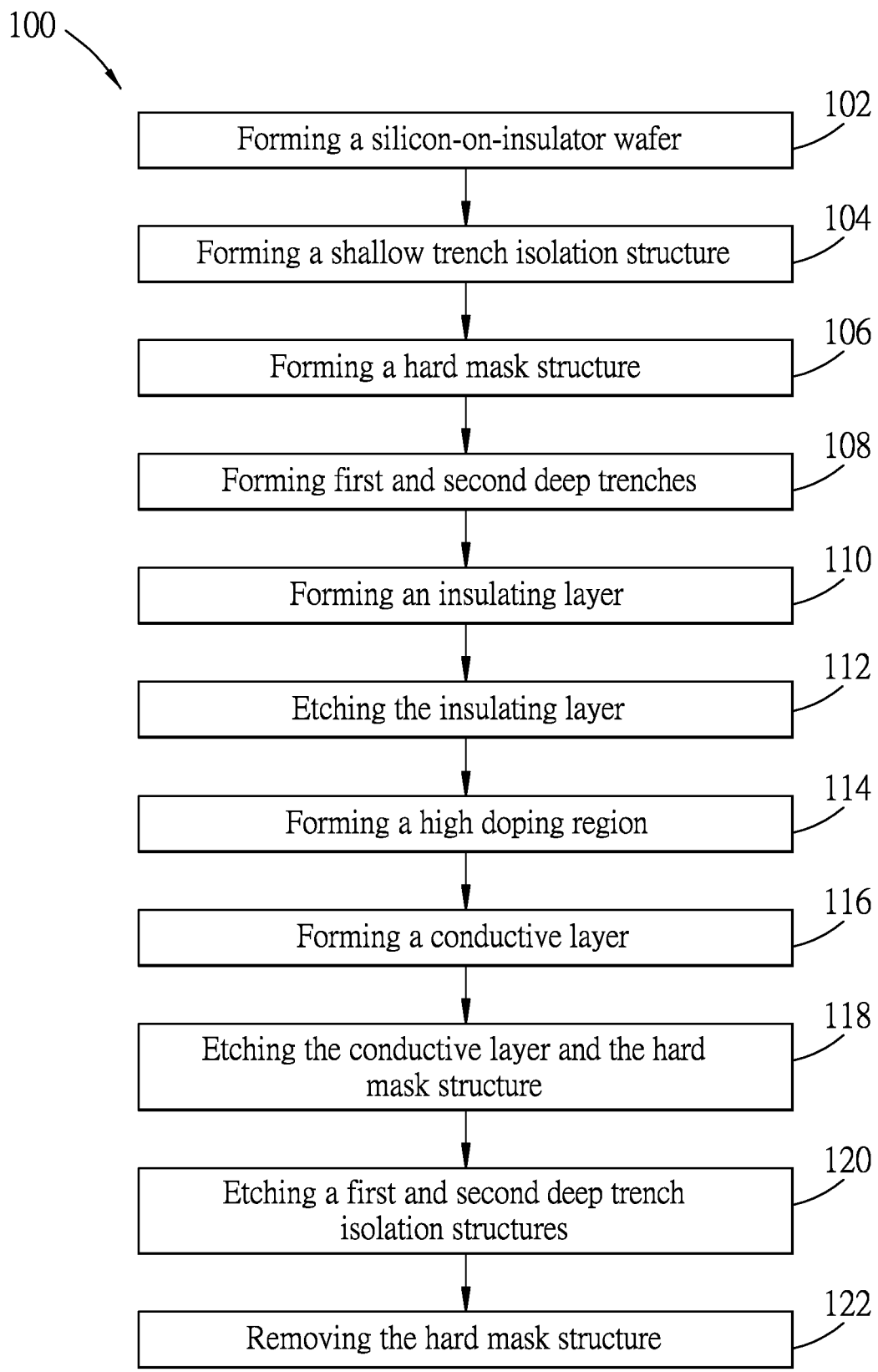
FIG. 1 is a flow diagram of a method for making a semiconductor isolation structure in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "above," "over," "downwardly," "upwardly," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a method 100 for manufacturing a semiconductor isolation structure 200 (see FIG. 18) in accordance with some embodiments. FIGS. 2 to 18 are schematic views showing intermediate stages of the method 100 as depicted in FIG. 1. Additional steps can be provided before, after or during the method 100, and some of the steps described herein may be replaced by other steps or be eliminated. Similarly, further additional features may be present in the semiconductor isolation structure 200, and/or features present may be replaced or eliminated in additional embodiments.

Referring to FIG. 1, the method 100 begins at block 102, where a silicon-on-insulation wafer is formed. Referring to the example illustrated in FIG. 2, in some embodiments, the silicon-on-insulation wafer 210 includes a semiconductor substrate 211, a buried insulation layer 212 disposed on the semiconductor substrate 211, and a semiconductor layer 213 disposed on the buried insulation layer 212. In some embodiments, the semiconductor substrate 211 may be a suitable substrate, such as an elemental semiconductor or a compound semiconductor. The elemental semiconductor may contain a single species of atoms, such as Si, Ge or other suitable materials, e.g., other elements from column XIV of the periodic table. The compound semiconductor may be composed of at least two elements, such as GaAs, SiC, SiGe, GaP, InSb, InAs, InP, GaAsP, GaInP, GaInAs, AlGaAs, AlInAs, GaInAsP, or other suitable materials. In some embodiments, the composition of the compound semiconductor may change from one ratio at one location to another ratio at a different location (i.e., the compound semiconductor may have a gradient composition). In some embodiments, the buried insulation layer 212 may be a buried oxide (BOX) layer. In some embodiments, the semiconductor layer 213 may be made of Si, Ge, SiGe, any combination thereof, or other suitable materials. The silicon-on-insulation wafer 210 may be made using separation by implantation of oxygen (SIMOX), wafer bonding, epitaxial growth and/or other suitable methods.

Figure 2:
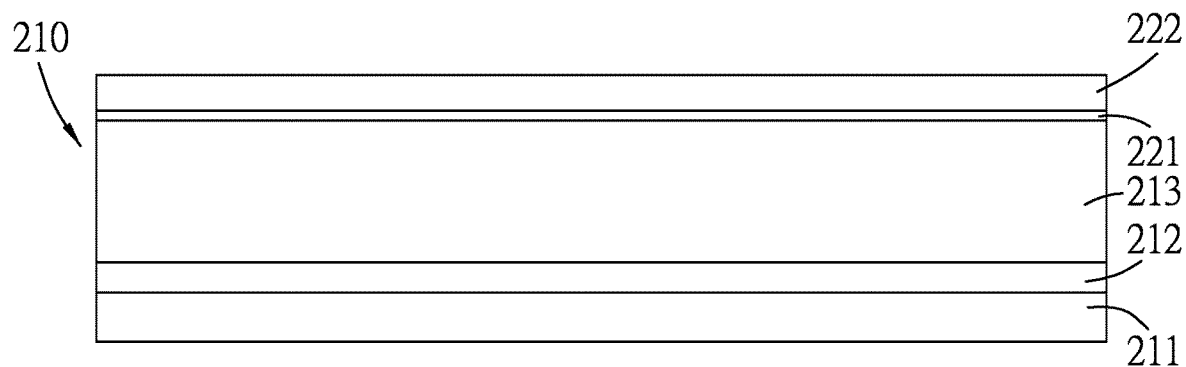
FIGS. 2 to 18 are schematic views showing intermediate stages of the method for making the semiconductor isolation structure in accordance with some embodiments.

FIG. 2 also illustrates that, after forming the silicon-on-insulation wafer 210, a pad oxide layer 221 may be formed on the semiconductor layer 213 of the silicon-on-insulation wafer 210, and a pad nitride layer 222 may be formed on the pad oxide layer 221, in accordance with some embodiments. Thickness of each of the pad oxide layer 221 and the pad nitride layer 222 may be determined according to practical requirements. The pad oxide layer 221 may be a thin film including silicon oxide (e.g., $SiO_2$). In some embodiments, the pad oxide layer 221 may be formed by thermally oxidizing a top surface of the semiconductor layer 213 of the silicon-on-insulation wafer 210. In other embodiments, the pad oxide layer 221 may be formed by depositing an oxide layer on the top surface of the semiconductor layer 213 of the silicon-on-insulation wafer 210 using chemical vapor deposition (CVD), atomic layer deposition (ALD), or other suitable techniques. In some embodiments, the pad oxide layer 221 may act as an adhesion layer between the semiconductor layer 213 of the silicon-on-insulation wafer 210 and the pad nitride layer 222. In some embodiments, the pad oxide layer 221 may also act as an etch stop layer for etching the pad nitride layer 222. Such etching process will be elaborated in the description associated with FIGS. 15 and 16 of this disclosure. In some embodiments, the pad nitride layer 222 may be a thin film including silicon nitride (e.g., $Si_3N_4$) or other suitable hard mask materials. In some embodiments, the pad nitride layer 222 may be formed using CVD, ALD, or other suitable techniques. In some embodiments, the pad nitride layer 222 may be deposited using plasma-enhanced chemical vapor deposition (PECVD), low-pressure chemical vapor deposition (LPCVD), or other suitable techniques.

Figure 3:
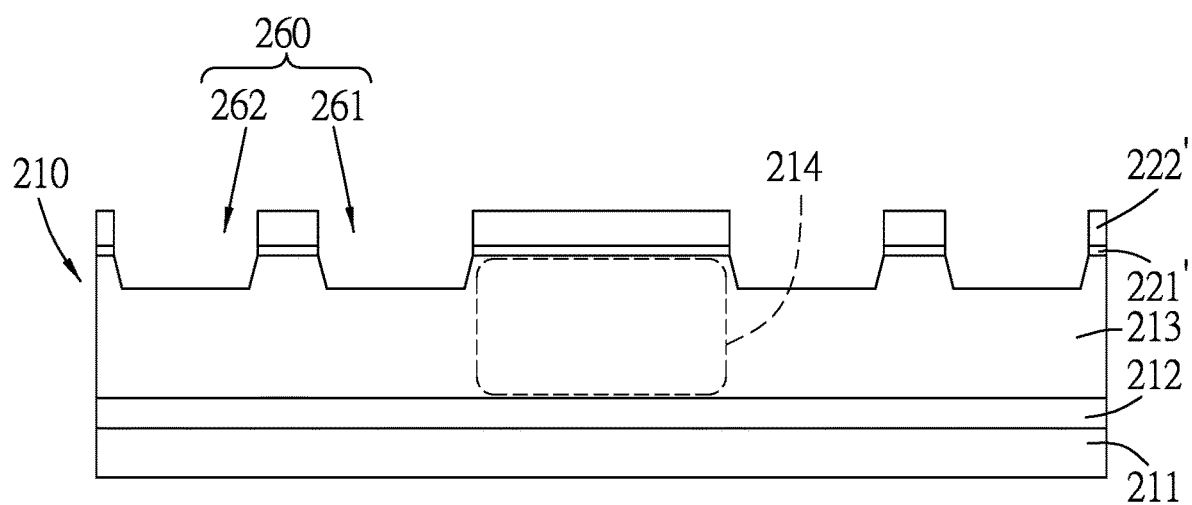
Figure 4:
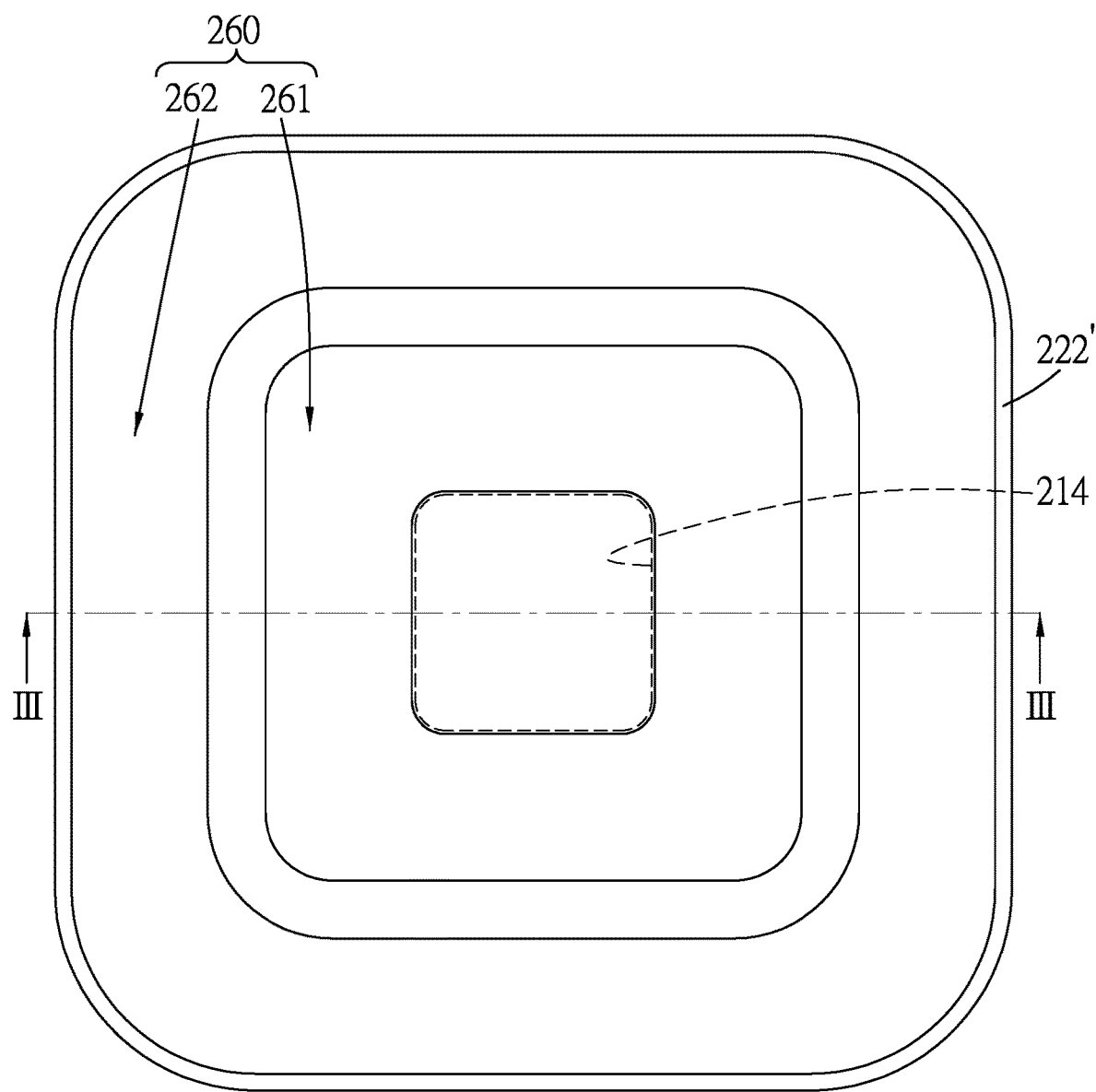

FIG. 3 illustrates that, after forming the pad oxide layer 221 and the pad nitride layer 222 (see FIG. 2), the pad oxide layer 221 and the pad nitride layer 222 may be etched using a patterned photoresist layer (not shown) disposed on the pad nitride layer 222 as an etch mask, followed by etching the semiconductor layer 213 using the etched pad oxide layer 221' and the etched pad nitride layer 222' as etch masks to form a shallow trench structure 260. In some embodiments, each of the pad nitride layer 222, the pad oxide layer 221 and the semiconductor layer 213 may be etched using a suitable technique, such as plasma dry etch with an etchant including $CF_4$, $CHF_3$, $SF_6$, $NF_3$, $O_2$, Ar, $N_2$ and He, or other suitable etchants, or any combination thereof. Referring to FIGS. 3 and 4, in some embodiments, the shallow trench structure 260 may surround a functional region 214 of the silicon-on-insulator wafer 210, which may be used for forming doped regions of a semiconductor device (not shown). It is noted that FIG. 4 is a schematic top view showing how the shallow trench structure 260 may surround the functional region 214 in accordance with some embodiments. Note that the functional region 214 is not visible in a top view, however, for illustration purpose, FIG. 4 schematically shows that the functional region 214 is surrounded by the shallow trench structure 260. FIG. 3 may be a sectional view taken along line of FIG. 4. In some embodiments, the shallow trench structure 260 may include a first shallow trench 261 that surrounds the functional region 214, and a second shallow trench 262 that surrounds the first shallow trench 261.

Figure 5:
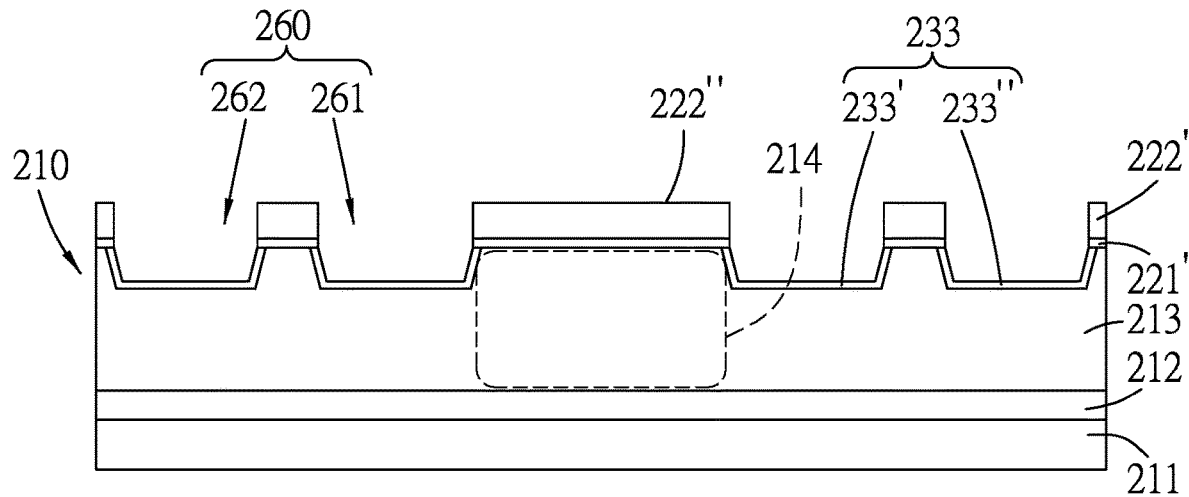

FIG. 5 illustrates that, after forming the shallow trench structure 260, a liner structure 233 may be formed in the shallow trench structure 260. In some embodiments, the liner structure 233 may be formed by thermally oxidizing a surface of the semiconductor layer 213 exposed from the etched pad oxide layer 221' and the etched pad nitride layer 222'. That is, the liner structure 233 may be a thin film including silicon oxide and/or other suitable materials. In some embodiments, the liner structure 233 may include a first liner 233' that is formed in the first shallow trench 261, and a second liner 233" that is formed in the second shallow trench 262. In some embodiments, the liner structure 233 may serve to alleviate or cover damages of the exposed surface of the semiconductor layer 213 caused by the abovementioned etching of the semiconductor layer 213, and may also serve to improve adhesion between the semiconductor layer 213 and subsequently formed shallow trench isolation (STI) structure 230 shown in FIG. 7.

Figure 6:
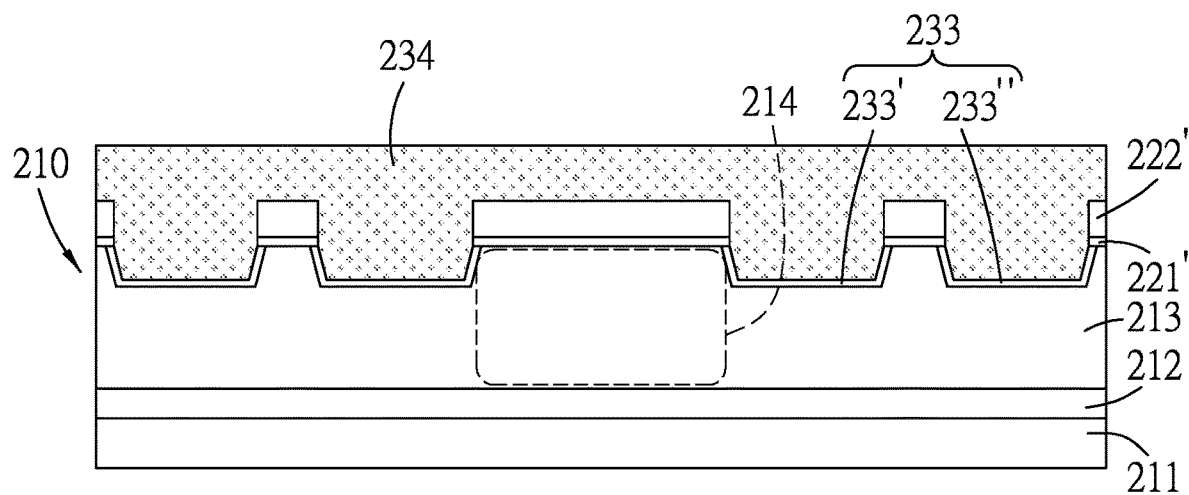

FIG. 6 illustrates that, after forming the liner structure 233, a dielectric structure 234 may be formed. In some embodiments, the dielectric structure 234 may be formed on a top surface 222" of the etched pad nitride layer 222' (see FIG. 5) and may be formed to fill the shallow trench structure 260 (see FIG. 5). In some embodiments, the dielectric structure 234 may be made of an oxide material (e.g., $SiO_2$, etc.) or other suitable materials, and may be formed using PECVD, LPCVD, or other suitable techniques.

Figure 7:
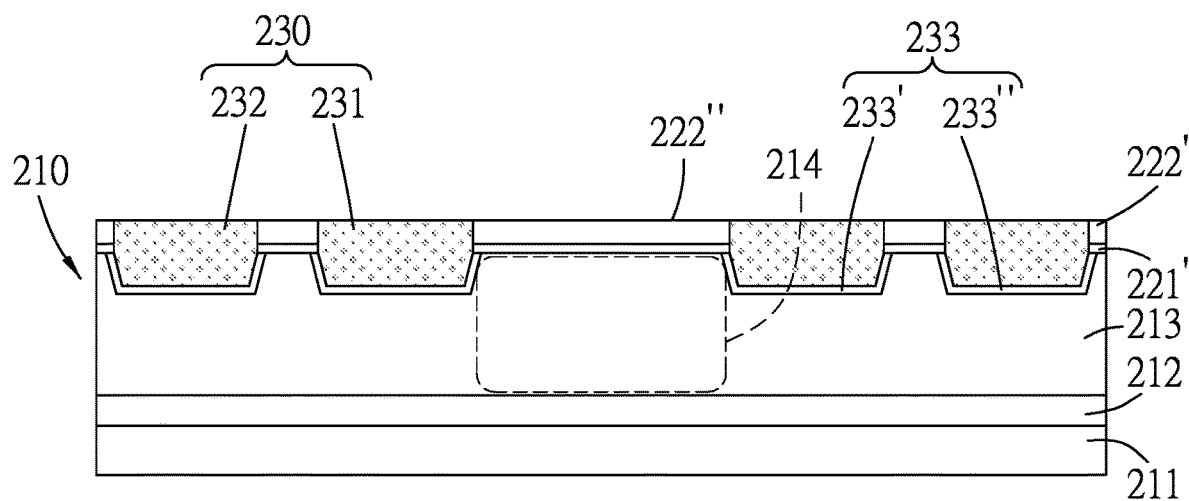

FIG. 7 illustrates that, after the dielectric structure 234 is formed, a portion of the dielectric structure 234 above the top surface 222" of the etched pad nitride layer 222' may be removed to obtain the shallow trench isolation structure 230 formed in the semiconductor layer 213. In some embodiments, the portion of the dielectric structure 234 may be removed using chemical mechanical planarization (CMP), etch back, other suitable techniques, or any combination thereof. In some embodiments, the etched pad nitride layer 222' may serve as an etch stop layer during etching of the dielectric structure 234, and may be slightly etched. In some embodiments, the shallow trench isolation structure 230 may include a first shallow trench isolation 231 filling the first shallow trench 261 of the shallow trench structure 260 (see FIG. 5), and a second shallow trench isolation 232 filling the second shallow trench 262 of the shallow trench structure 260 (see FIG. 5). In some embodiments, the first shallow trench isolation 231 surrounds the functional region 214, and the second shallow trench isolation 232 surrounds the first shallow trench isolation 231.

In some embodiments, the step of forming the pad oxide layer 221 and the pad nitride layer 222 shown in FIG. 2 and the steps shown in FIGS. 3, 5, 6 and 7 may be collectively referred to as a step of forming a shallow trench isolation structure as illustrated in block 104 of FIG. 1.

Figure 8:
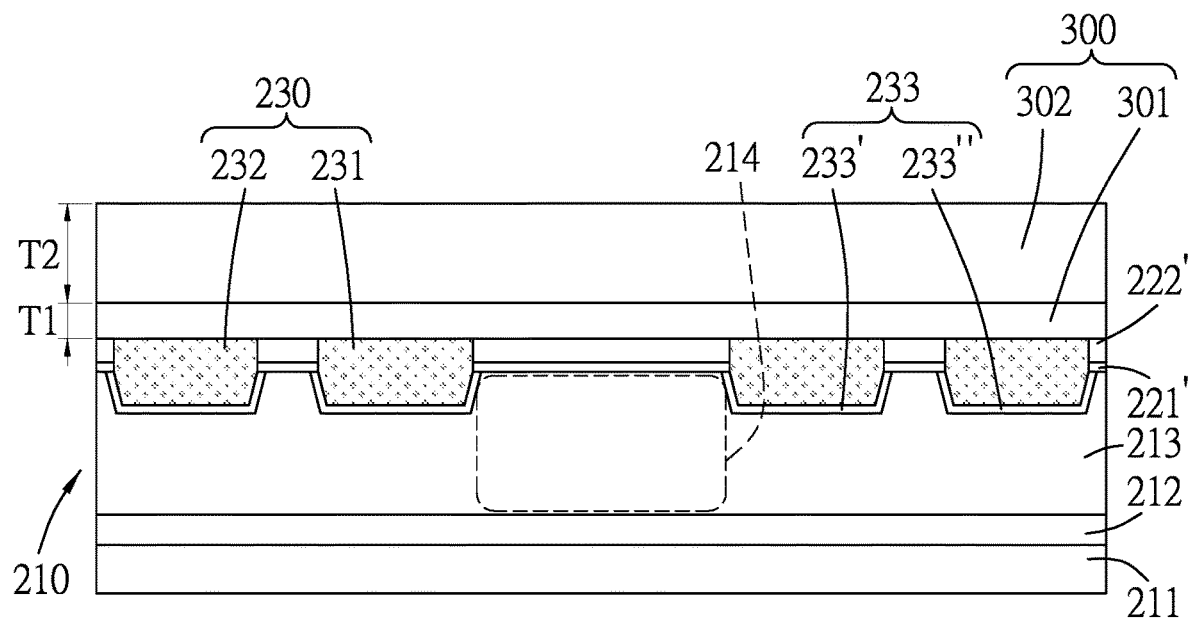

Referring to FIG. 1, the method 100 then proceeds to block 106, where a hard mask structure is formed. FIG. 8 schematically illustrates the step of block 106 of FIG. 1, where the hard mask structure 300 is formed on the top surface 222" of the etched pad nitride layer 222' (see FIG. 7). In some embodiments, the hard mask structure 300 may include a first hard mask layer 301 that is disposed on the top surface 222" of the etched pad nitride layer 222' (see FIG. 7), and a second hard mask layer 302 that is disposed on the first hard mask layer 301. In some embodiments, the first hard mask layer 301 is made of a suitable hard mask material, such as silicon nitride, etc. In some embodiments, the second hard mask layer 302 may be made of a low-stress material, such as a low-stress oxide (e.g., undoped silicon glass (USG), etc.), other suitable hard mask materials, or any combination thereof. In some embodiments, the first hard mask layer 301 may have a thickness (T1) ranging from about 1400 Å to about 1800 Å, but other range values are also within the scope of this disclosure; and in other embodiments, the thickness (T1) of the first hard mask layer 301 may range from about 1440 Å to about 1760 Å or from about 1500 Å to about 1600 Å, but other range values are also within the scope of this disclosure. In some embodiments, the second hard mask layer 302 may have a thickness (T2) ranging from about 9000 Å to about 13000 Å, but other range values are also within the scope of this disclosure; and in other embodiments, the thickness (T2) of the second hard mask layer 302 may range from about 9900 Å to about 12100 Å or from about 10000 Å to about 11000 Å, but other range values are also within the scope of this disclosure.

Figure 9:
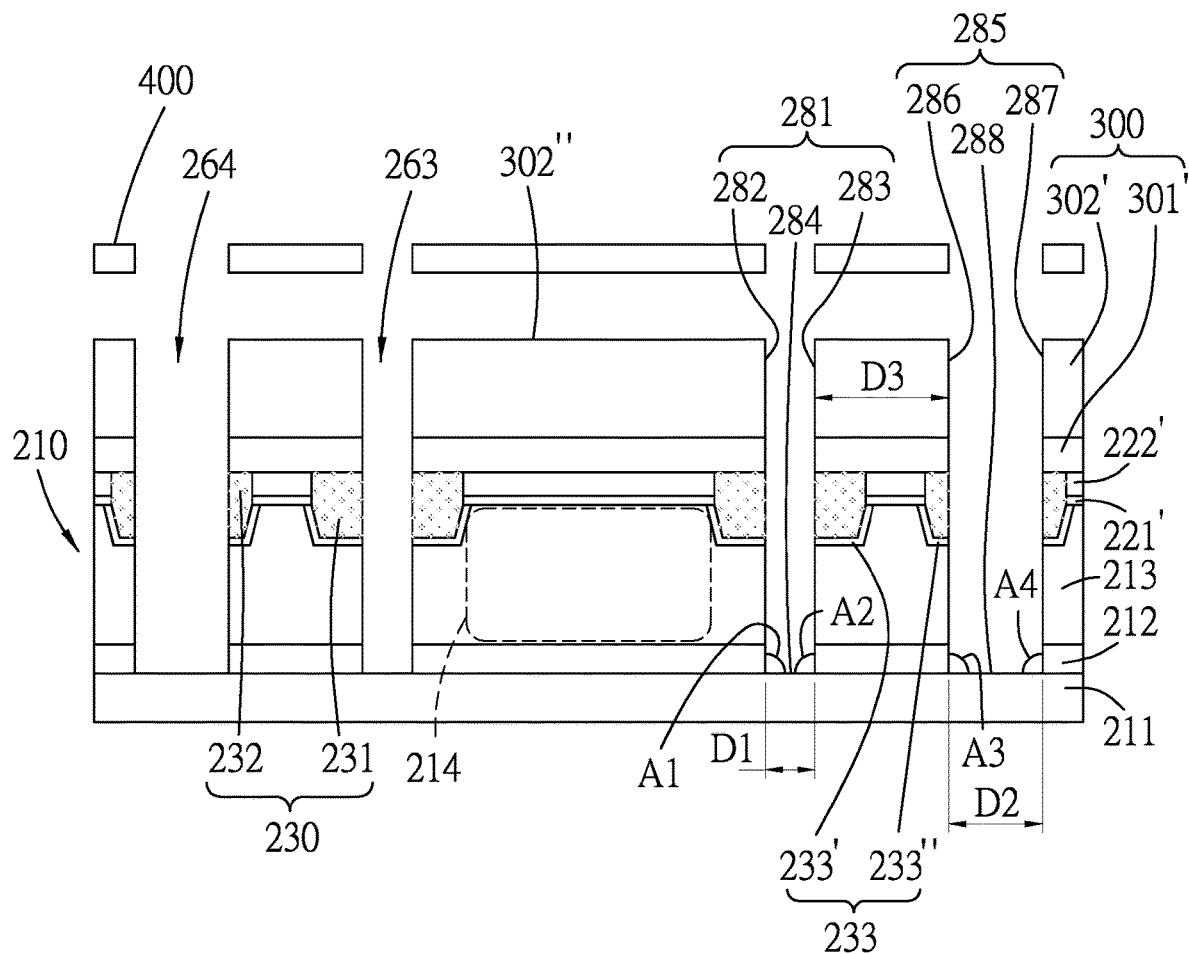
Figure 10:
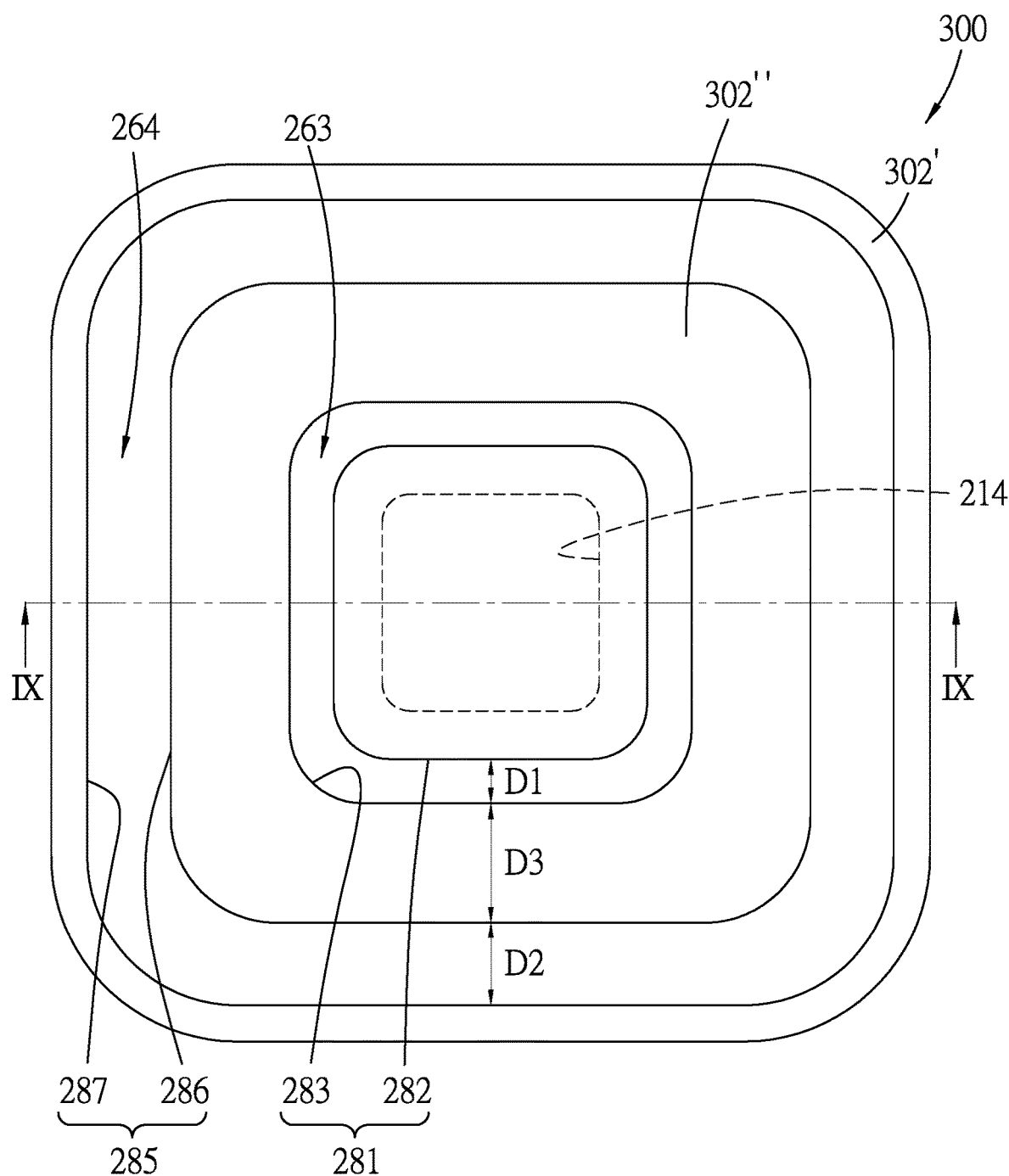

Referring to FIG. 1, the method 100 then proceeds to block 108, where a first deep trench and a second deep trench are formed. FIG. 9 illustrates that, in some embodiments, a patterned mask 400 may be provided, followed by etching the first hard mask layer 301 and the second hard mask 302 (see FIG. 8) using the patterned mask 400 as an etch mask. In some embodiments, each of the first hard mask layer 301 and the second hard mask layer 302 may be etched using a suitable etching technique, such as plasma dry etch with an etchant including $CF_4$, $CHF_3$, $SF_6$, $NF_3$, $O_2$, Ar, $N_2$ and He, or other suitable etchants, or any combination thereof. Then, the etched first hard mask layer 301' and the etched second hard mask layer 302' may serve as an etch mask, and the first shallow trench isolation 231, the second shallow trench isolation 232, the first liner 233', the second liner 233", the semiconductor layer 213 and the buried insulation layer 212 are etched to form the first deep trench 263 and the second deep trench 264. In some embodiments, each of the first shallow trench isolation 231, the second shallow trench isolation 232, the first liner 233', the second liner 233", the semiconductor layer 213 and the buried insulation layer 212 may be etched using a suitable etching technique, such as plasma dry etch with an etchant including $CF_4$, $CHF_3$, $SF_6$, $NF_3$, $O_2$, Ar, $N_2$ and He, or other suitable etchants, or any combination thereof. Referring to FIGS. 9 and 10, in some embodiments, the first deep trench 263 surrounds the functional region 214, and the second deep trench 264 surrounds the first deep trench 263. Note that the functional region 214 is not visible in a top view, however, for illustration purpose, FIG. 10 schematically shows that the functional region 214 is surrounded by the first deep trench 263. FIG. 9 may be a sectional view taken along line IV-IV of FIG. 10. As shown in FIG. 9, the first deep trench 263 may penetrate the etched second hard mask layer 302', the etched first hard mask layer 301', the first shallow trench isolation 231, the first liner 233', the semiconductor layer 213 and the buried insulation layer 212 so as to contact the semiconductor substrate 211. In some embodiments, the first deep trench 263 may slightly extend into the semiconductor substrate 211. The second deep trench 264 may penetrate the etched second hard mask layer 302', the etched first hard mask layer 301', the second shallow trench isolation 232, the second liner 233", the semiconductor layer 213 and the buried insulation layer 212 so as to contact the semiconductor substrate 211. In some embodiments, the second deep trench 264 may slightly extend into the semiconductor substrate 211.

Figure 11:
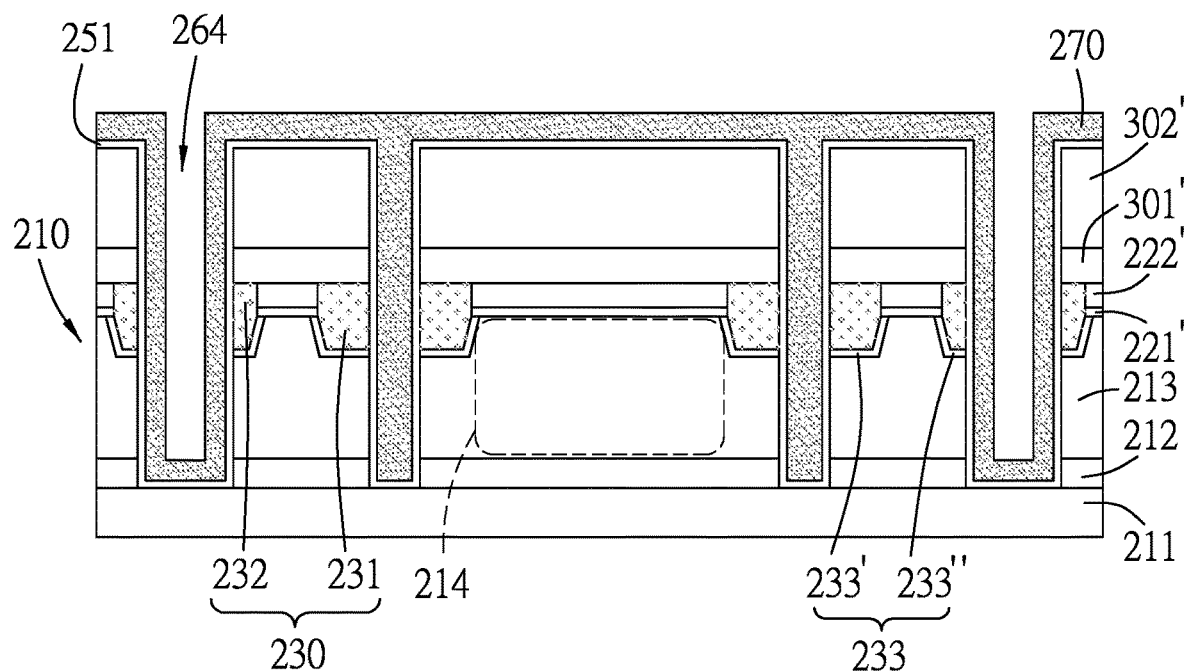

As shown in FIGS. 9 and 10, in some embodiments, the first deep trench 263 may be defined by a first trench-defining wall 281, which has opposite first and second side portions 282, 283 and a bottom portion 284 connected between the first and second side portions 282, 283. In some embodiments, an included angle (A1) between the first side portion 282 of the first trench-defining wall 281 and the bottom portion 284 of the first trench-defining wall 281 may range from about 90° to about 92°, but other range values are also within the scope of this disclosure; and an included angle (A2) between the second side portion 283 of the first trench-defining wall 281 and the bottom portion 284 of the first trench-defining wall 281 may range from about 90° to about 92°, but other range values are also within the scope of this disclosure. In some embodiments, the first deep trench 263 has a lateral width (D1), which is equal to a distance between the first side portion 282 and the second side portion 283 of the first trench-defining wall 281, and which ranges from about 0.8 μm to about 1.2 μm or ranges from about 0.9 to about 1 but other range values are also within the scope of this disclosure. If the lateral width (D1) of the first deep trench 263 is too small, such as smaller than about 0.8 μm in some embodiments, a dielectric material may not be properly disposed in the first deep trench 263 during the formation of an insulating layer 270 as shown in FIG. 11. For example, the dielectric material may seal a top portion of the first deep trench 263 while leaving a bottom portion of the first deep trench 263 not completely filled with the dielectric material. If the lateral width (D1) of the first deep trench 263 is too large, such as greater than about 1.2 μm in some embodiments, the dielectric material may not completely fill the first deep trench 263 due to the large dimension of the first deep trench 263. In some embodiments, the second deep trench 264 may be defined by a second trench-defining wall 285, which has opposite first and second side portions 286, 287 and a bottom portion 288 connected between the first and second side portions 286, 287. In some embodiments, an included angle (A3) between the first side portion 286 of the second trench-defining wall 285 and the bottom portion 288 of the second trench-defining wall 285 may range from about 90° to about 92°, but other range values are also within the scope of this disclosure; and an included angle (A4) between the second side portion 287 of the second trench-defining wall 285 and the bottom portion 288 of the second trench-defining wall 285 may range from about 90° to about 92°, but other range values are also within the scope of this disclosure. In some embodiments, the second deep trench 264 has a lateral width (D2), which is equal to a distance between the first side portion 286 and the second side portion 287 of the second trench-defining wall 285, and which ranges from about 1.8 μm to about 2.2 μm or ranges from about 1.9 μm to about 2.0 μm, but other range values are also within the scope of this disclosure. If the lateral width (D2) of the second deep trench 264 is too small, such as smaller than about 1.8 μm in some embodiments, the dielectric material may not be properly disposed in the second deep trench 264 during the formation of the insulating layer 270 (see FIG. 11). For example, the dielectric material may seal a top portion of the second deep trench 264 while leaving a bottom portion of the second deep trench 264 not completely filled with the dielectric material. In other examples, if the lateral width (D2) of the second deep trench 264 is too small, such as smaller than about 1.8 μm, the dielectric material may occupy a large portion of the second deep trench 264, such that the subsequently formed conductive layer 271 (see FIG. 14) may not properly fill the second deep trench 264 or the overall volume of the conductive layer 271 formed in the second deep trench 264 may be too small, resulting in high resistivity of the conductive layer 271. If the lateral width (D2) of the second deep trench 264 is too large, such as greater than about 2.2 μm in some embodiments, the dielectric material and the conductive layer 271 may not completely fill the second deep trench 264 due to the large dimension of the second deep trench 264. In some embodiments, a distance (D3) between the first and second deep trenches 263, 264 (i.e., the distance (D3) between the second side portion 283 of the first trench-defining wall 281 and the first side portion 286 of the second trench-defining wall 285) may range from about 1.8 μm to about 2.2 μm or ranges from about 1.9 μm to about 2.0 μm, but other range values are also within the scope of this disclosure. If the distance (D3) is too smaller, such as smaller than about 1.8 μm in some embodiments, it might be difficult to precisely define the first and second deep trenches 263, 264 in a lithography process and/or an etching process. If the distance (D3) is too large, such as greater than about 2.2 μm in some embodiments, the semiconductor isolation structure 200 (see FIG. 18) may have a rather large overall dimension. In some embodiments, the lateral width (D1) of the first deep trench 263 may be smaller than the lateral width (D2) of the second deep trench 264.

Referring to FIG. 1, the method 100 then proceeds to block 110, where the insulating layer is formed. Referring to FIG. 11, in some embodiments, a liner layer 251 may be formed before forming the insulating layer 270. In some embodiments, the liner layer 251 may be formed on a top surface 302" of the etched second hard mask layer 302' (see FIGS. 9 and 10), the first trench-defining wall 281 and the second trench-defining wall 285. In some embodiments, the liner layer 251 may be formed using thermal oxidation, CVD, ALD or other suitable techniques, and may be a thin film including silicon oxide and/or other suitable materials. In some embodiments, the liner layer 251 may have a thickness ranging from about 90 Å to about 110 Å or ranging from about 95 Å to about 100 Å, but other range values are also within the scope of this disclosure. Then, the insulating layer 270 is formed on the liner layer 251 (i.e., formed on the top surface 302" of the etched second hard mask layer 302', the first trench-defining wall 281 and the second trench-defining wall 285). In some embodiments, an insulating material is deposited until the first deep trenches 263 (see FIGS. 9 and 10) is completely filled, and the second deep trench 264 is partially filled by the insulating material with the first side portion 286, the second side portion 287 and the bottom portion 288 of the second trench-defining wall 285 covered by the insulating material, thereby forming the insulating layer 270. In some embodiments, the insulating layer 270 may be conformally formed using CVD, ALD or other suitable techniques, and may be made of an oxide-based material, such as silicon oxide and/or other suitable materials. In some embodiments, the insulating layer 270 may have a thickness ranging from about 8550 Å to about 10450 Å or from about 9000 Å to about 9500 Å, but other range values are also within the scope of this disclosure.

Figure 12:
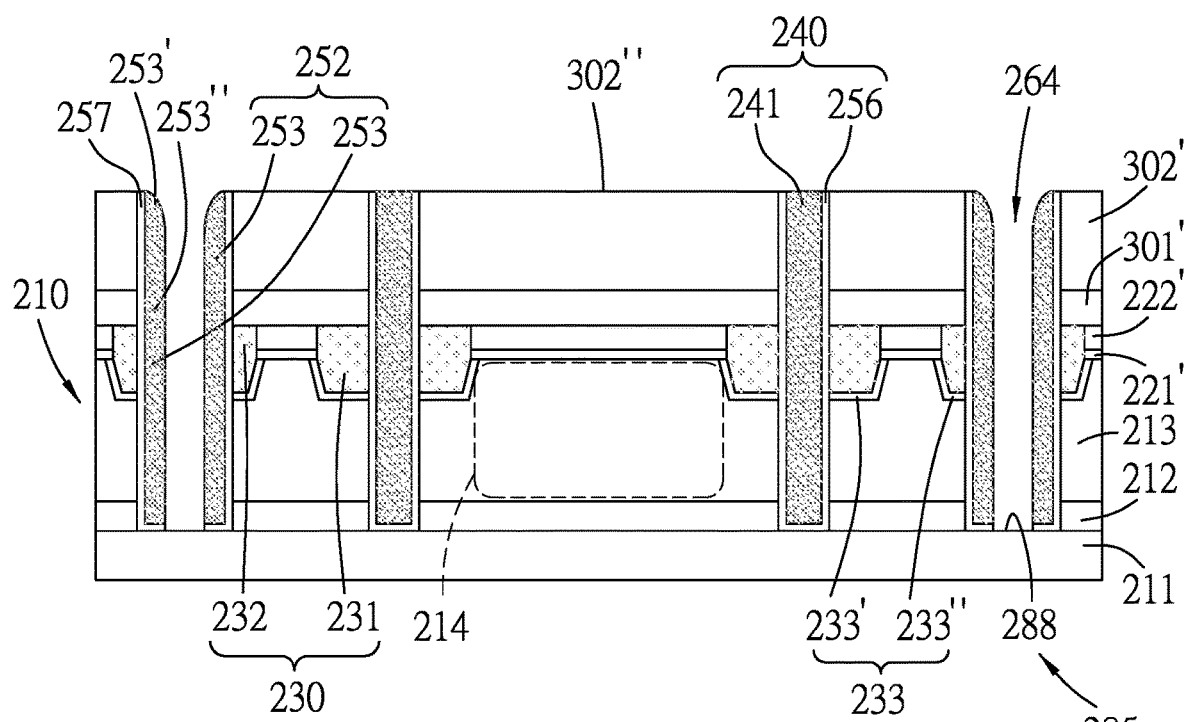

Referring to FIG. 1, the method 100 then proceeds to block 112, where the insulating layer is etched. Referring to FIGS. 11 and 12, in some embodiments, the liner layer 251 and the insulating layer 270 may be etched using a suitable etching technique, such as vertical and anisotropic dry etch to remove the liner layer 251 and the insulating layer 270 (see FIG. 11) on the top surface 302" of the etched second hard mask layer 302' and to remove a portion of the insulating layer 270 formed on the bottom portion 288 of the second trench-defining wall 285, so as to form a first deep trench isolation (DTI) structure 240 in the first deep trench 263 and an isolation layer 252 in the second deep trench 264. In some embodiments, the first DTI structure 240 includes a dielectric segment 241 which is a portion of the insulating layer 270 shown in FIG. 11, and a first liner segment 256 which is a portion of the liner layer 251 shown in FIG. 11. The first DTI structure 240 completely fills the first deep trench 263 (see FIGS. 9 and 10). In some embodiments, the isolation layer 252 cooperates with a second liner segment 257 (which is a portion of the liner layer 251 shown in FIG. 11) to partially fill the second deep trench 264. In some embodiments, the isolation layer 252 may include two isolation segments 253 that are respectively formed on the first side portion 286 and the second side portion 287 of the second trench-defining wall 285 (see FIGS. 9 and 10). In some embodiments, each of the isolation segments 253 of the isolation layer 252 is partially etched by the vertical and anisotropic dry etch such that an upper portion 253' of each of the isolation segments 253 has a lateral width smaller than that of a lower portion 253" of the isolation segment 253. In some embodiments, the liner layer 257 formed on the bottom portion 288 of the second trench-defining wall 285 may be etched to expose a portion of the bottom portion 288 of the second trench-defining wall 285 (i.e., a portion of the semiconductor substrate 211 is exposed from the second deep trench 264). In some embodiments, each of the isolation segments 253 may have a maximum thickness (i.e., a lateral width measured in a direction substantially parallel to the semiconductor substrate 211) ranging from about 0.6 μm to about 0.8 μm or from about 0.65 μm to about 0.7 μm, but other range values are also within the scope of this disclosure. If the maximum thickness of each of the isolation segments 253 is too large, such as greater than about 0.8 μm, there might be insufficient room for forming the conductive layer 271 (see FIG. 14). If the maximum thickness of each of the isolation segments 253 is too small, such as smaller than about 0.6 μm in some embodiments, the isolation segments 253 may not be able to protect the functional region 214.

Figure 13:
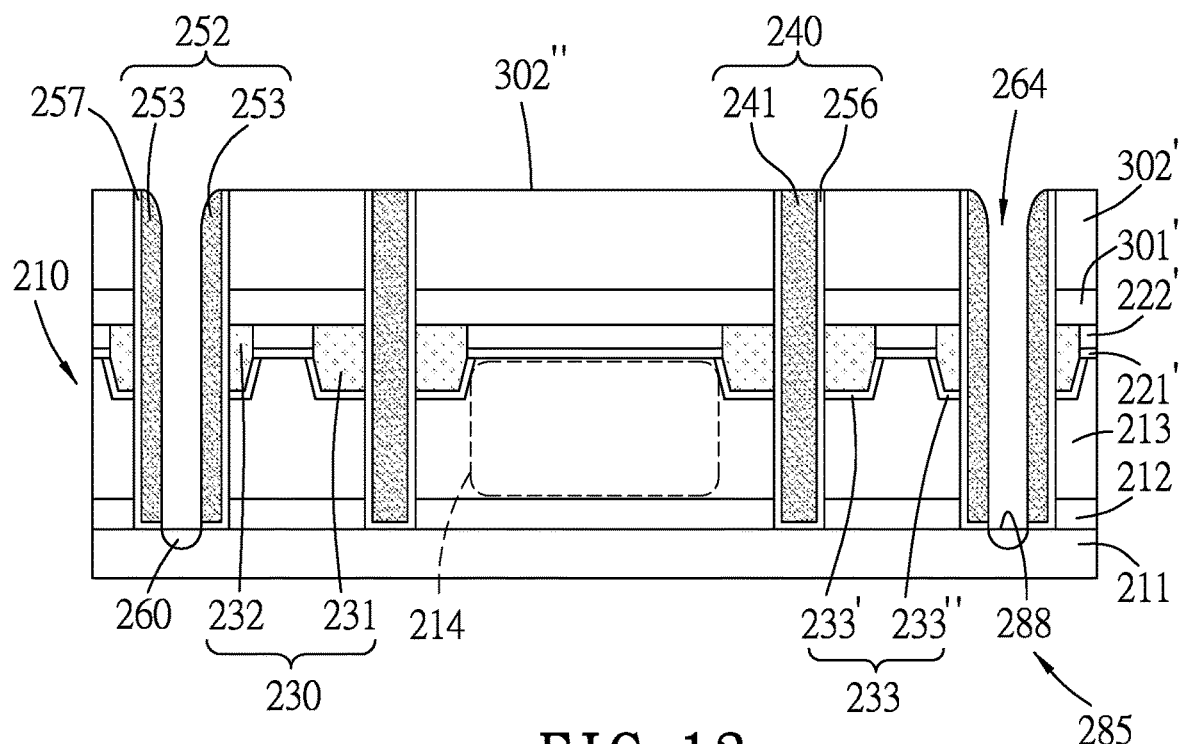

Referring to FIG. 1, the method 100 then proceeds to block 114, where a high doping region is formed. Referring to FIG. 13, in some embodiments, the high doping region 260 may be formed in the semiconductor substrate 211 by doping the portion of the semiconductor substrate 211 exposed from the second deep trench 264. An annealing process may be conducted after the doping process. In some embodiments, during the doping process, the isolation segments 253 of the isolation layer 252 may be slightly doped. In some embodiments, the semiconductor substrate 211 and the high doping region 260 have the same doping type. In some embodiments, the high doping region 260 has a doping concentration not smaller than about $1 \times 10^{15}/cm^3$ to about $1 \times 10^{16}/cm^3$, but other range values are also within the scope of this disclosure. In some embodiments, the high doping region 260 may serve as an ohmic contact between the semiconductor substrate 211 and a subsequently formed conductive structure 254 (see FIG. 16), which will be described in detail hereinafter.

Figure 14:
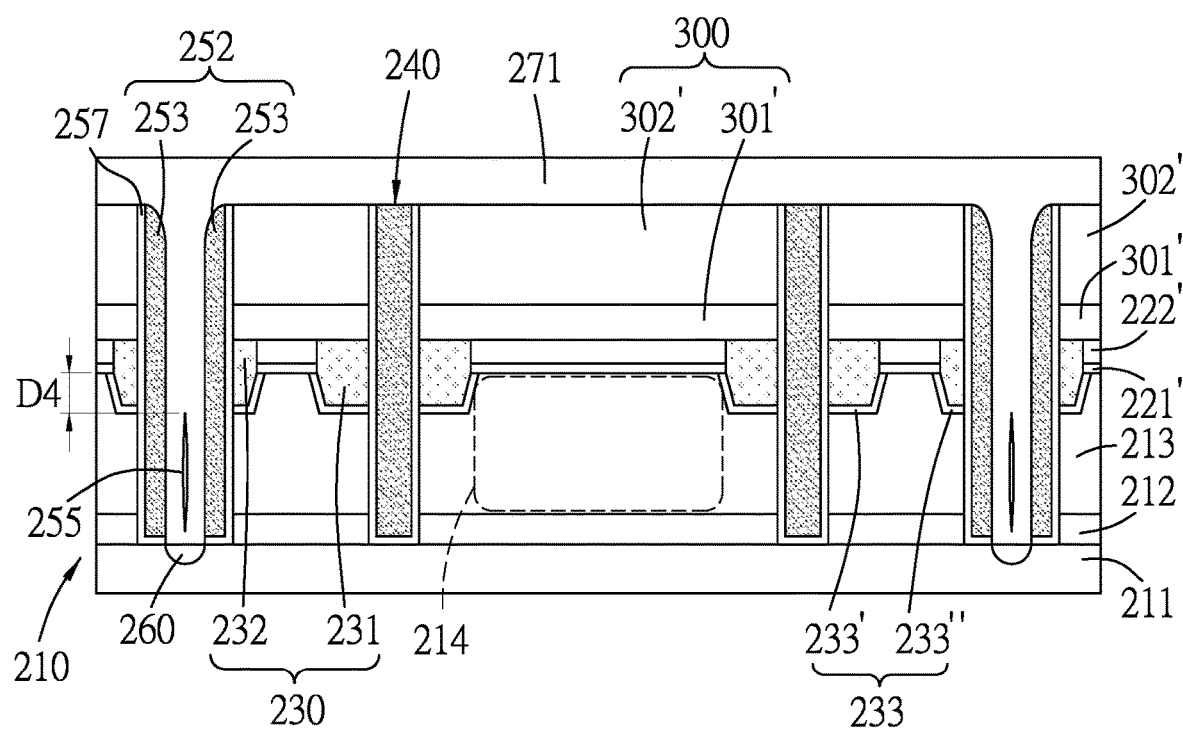

Referring to FIG. 1, the method 100 then proceeds to block 116, where the conductive layer is formed. Referring to FIG. 14, the conductive layer 271 may be formed on the top surface 302" of the etched second hard mask layer 302' (see FIG. 13) and to fill the second deep trench 264 (see FIG. 13). In some embodiments, before forming the conductive layer 271, a pre-clean process may be conducted to clean the portion of the semiconductor substrate 211 exposed from the second deep trench 264 (see FIG. 13) by using a wet etching technique or other suitable techniques employing hydrofluoric acid (HF) or other suitable etchants. In some embodiments, after the pre-clean process, each of the isolation segments 253 of the isolation layer 252 may be slightly etched to lose about 20 Å to about 30 Å in thickness, but other range values are also within the scope of this disclosure. In some embodiments, the conductive layer 271 may be formed using CVD, ALD or other suitable techniques, and may be made of polysilicon or other suitable conductive materials so as to be electrically connected to the semiconductor substrate 211. In some embodiments, the polysilicon may be undoped; and in other embodiments, the semiconductor substrate 211 and the polysilicon may have the same doping type. In some embodiments, a seam 255 may be formed in the conductive layer 271 within the second deep trench 264 (see FIG. 13). In some embodiments, the seam 255 may be at least 0.1 μm lower than a top surface of the semiconductor layer 213. That is, a distance (D4) between a top end of the seam 255 and a top surface of the semiconductor layer 213 may be not smaller than about 0.1 μm. If the distance (D4) is too small, such as smaller than 0.1 μm in some embodiments, the subsequent etching process illustrated in FIG. 16 may cause the seam 255 to be exposed from the conductive structure 254, which may adversely affect electrical connection of the conductive structure 254 to other components (not shown).

Figure 15:
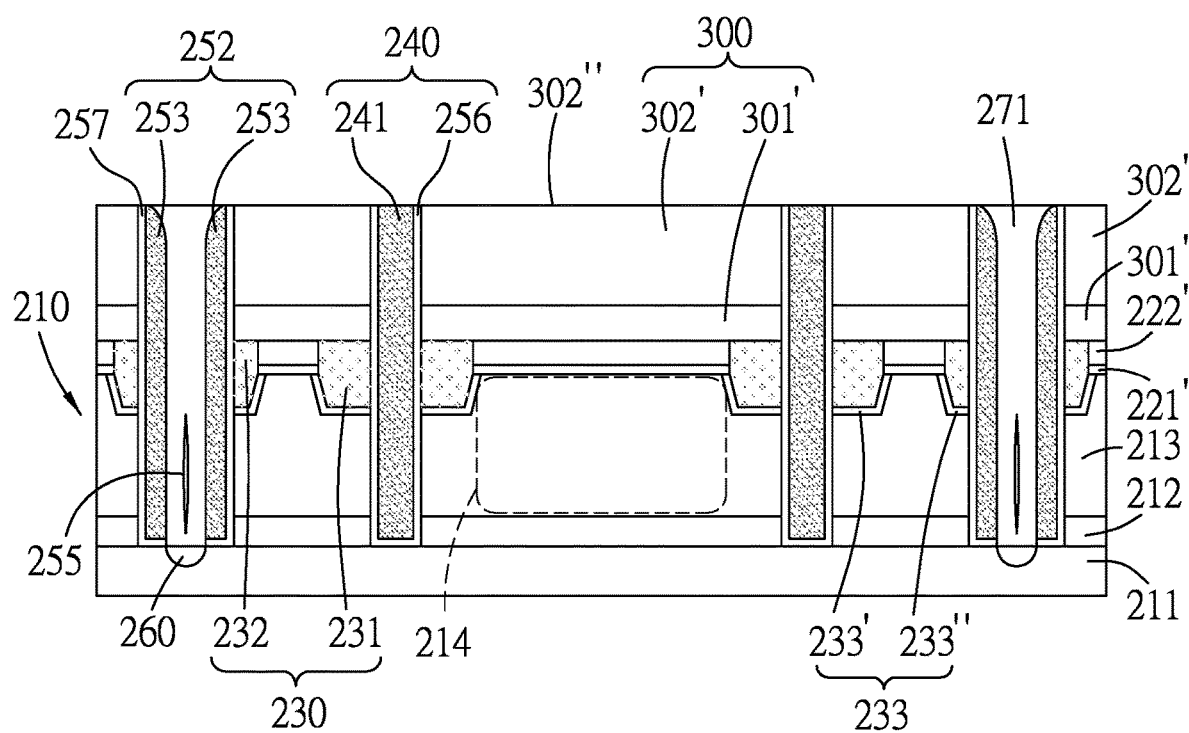
Figure 16:
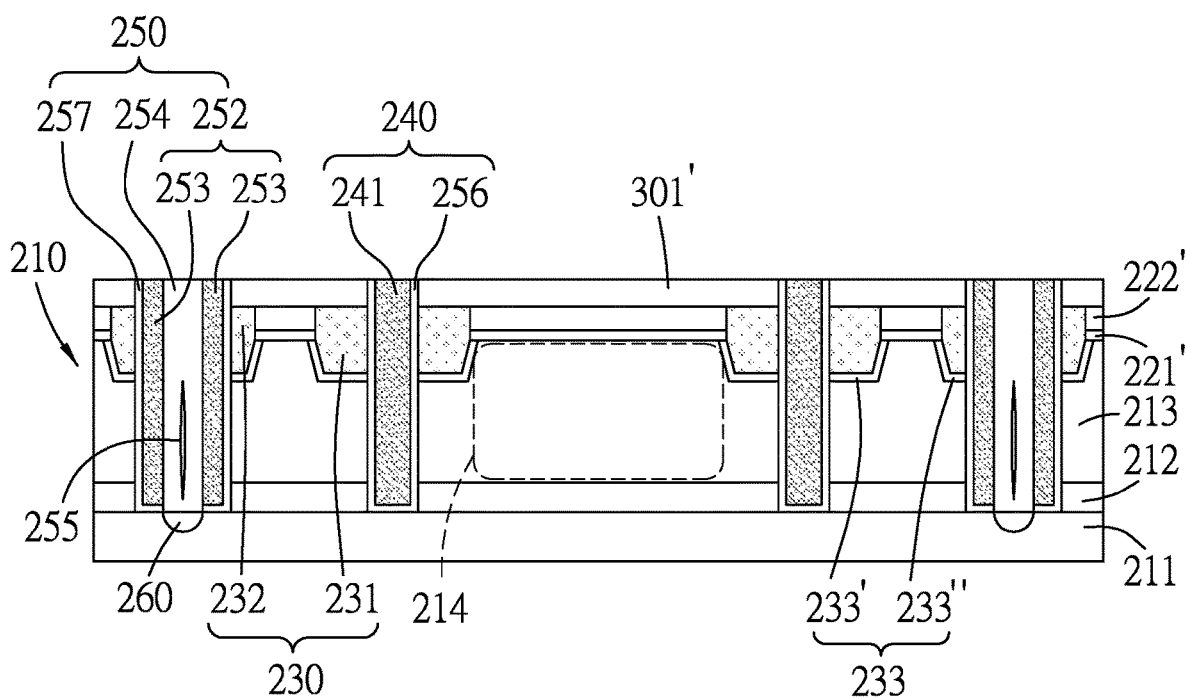

Referring to FIG. 1, the method 100 then proceeds to block 118, where the conductive layer and the hard mask structure are etched. The process of block 118 is illustrated in FIGS. 15 and 16. Referring to FIGS. 14 and 15, in some embodiments, the conductive layer 271 on the top surface 302" of the etched second hard mask layer 302' may be removed. Then, referring to FIGS. 15 and 16, the etched second hard mask layer 302' of the hard mask structure 300, the dielectric segment 241 and the first liner segment 256 of the first deep trench isolation structure 240 surrounded by the etched second hard mask layer 302', the isolation layer 252 surrounded by the etched second hard mask layer 302', the second liner segment 257 surrounded by the etched second hard mask layer 302' and the conductive layer 271 in the second deep trench 264 and surrounded by the etched second hard mask layer 302', are removed to form the conductive structure 254 in the second deep trench 264. Referring to FIG. 16, in some embodiments, the isolation layer 252, the conductive structure 254 and the second liner segment 257 may be collectively referred to as a second deep trench isolation structure 250. In some embodiments, the removal processes illustrated in FIGS. 15 and 16 may be conducted using a two-step CMP process (i.e., a first step illustrated in FIG. 15 and a second step illustrated in FIG. 16) or other suitable techniques. In some embodiments, the etched first hard mask layer 301' may serve as an etch stop layer for the etch process illustrated in FIG. 16.

Figure 17:
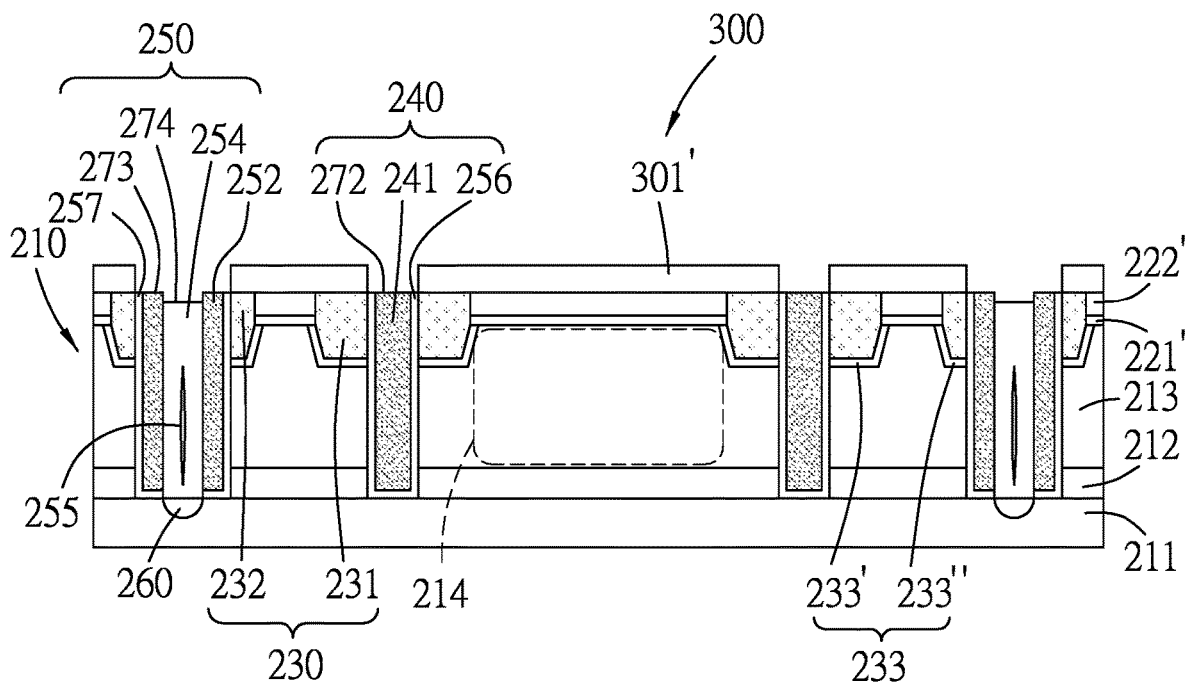

Referring to FIG. 1, the method 100 then proceeds to block 120, where the first and second deep isolation trench structures are etched. Referring to FIG. 17, in some embodiments, such etch process may be a two-step process. First, the dielectric segment 241 and the first liner segment 256 of the first deep trench isolation structure 240, and the isolation layer 252 and the second liner segment 257 of the second deep trench isolation structure 250, are etched using hydrofluoric acid (HF) or other suitable etchants. Then, the conductive structure 254 of the second deep trench isolation structure 250 is etched using a suitable technique, such as plasma dry etch with an etchant including $CF_4$, $CHF_3$, $SF_6$, $NF_3$, $O_2$, Ar, $N_2$ and He, or other suitable etchants, or any combination thereof. In some embodiments, after the two-step etch process, a top surface 272 of the first deep trench isolation structure 240 may be substantially flush with the top surface 222" of the etched pad nitride layer 222' (see FIG. 7), a top surface 273 of the second deep trench isolation structure 250 may be substantially flush with the top surface 222" of the etched pad nitride layer 222', and a top surface 274 of the conductive structure 254 of the second deep trench isolation structure 250 may be lower than the top surface 222" of the etched pad nitride layer 222'. In some embodiments, the conductive structure 254 is disposed in and surrounded by the isolation layer 252, and is electrically connected to the semiconductor substrate 211.

Figure 18:
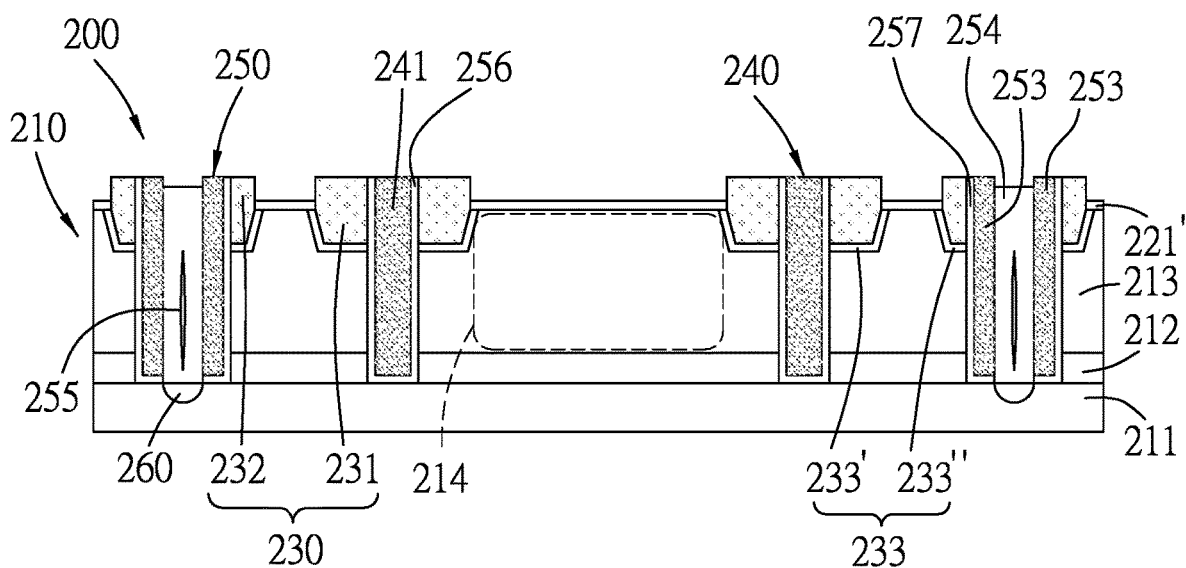
Figure 19:
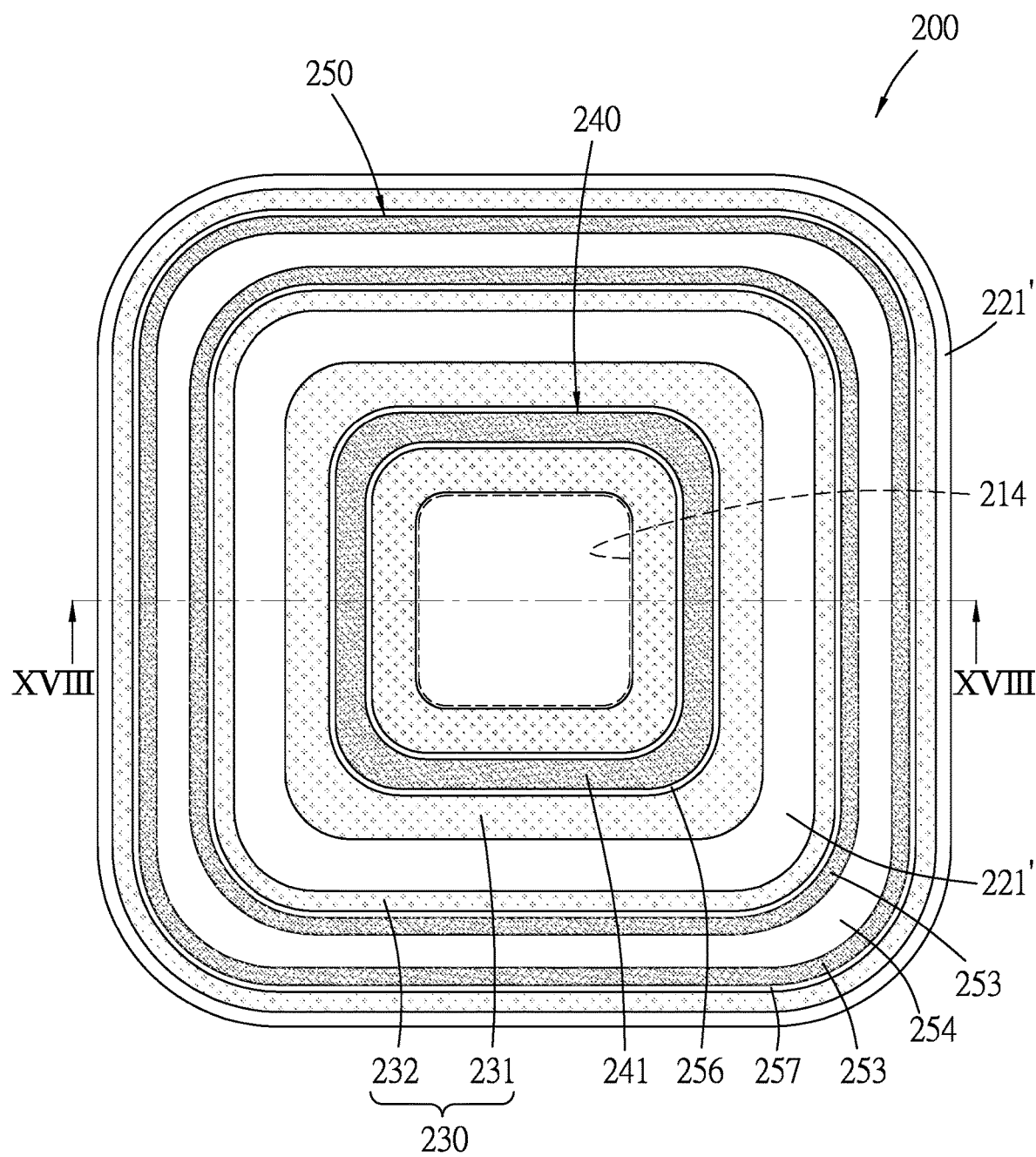
FIG. 19 is a schematic top view of the semiconductor isolation structure in accordance with some embodiments.

Referring to FIG. 1, the method 100 then proceeds to block 122, where the hard mask structure is removed. In some embodiments, the first hard mask layer 301' of the hard mask structure 300 is removed, and the etched pad nitride layer 222' may be removed as well. Such removal process may be conducted using phosphoric acid or other suitable etchants. The semiconductor isolation structure 200 is thus obtained. FIG. 19 is a schematic top view of the semiconductor isolation structure 200 in accordance with some embodiments, and FIG. 18 is a schematic sectional view taken along line XVIII-XVIII of FIG. 19, where the functional region 214 is surrounded by the first deep trench isolation structure 240, and the first deep trench isolation structure 240 is surrounded by the second deep trench isolation structure 250. In some embodiments, each of the first shallow trench isolation 231 and the second shallow trench isolation 232 of the shallow trench isolation structure 230 may partially extend out of the semiconductor layer 213. As shown in FIG. 19, in some embodiments, the first and second deep isolation structures 240, 250 are arranged in a concentric manner. It should be noted that the shape of each of the first and second deep isolation structures 240, 250 when viewed from above may be changed according to practical requirements, as long as the functional region 214 is surrounded by the first deep isolation structure 240, and the first deep isolation structure 240 is surrounded by the second deep isolation structure 250. In some embodiments, the semiconductor isolation structure 200 may then be processed with various semiconductor manufacturing processes so as to form the semiconductor device which corresponds in position to the functional region 214, and which may be a bipolar-CMOS-DMOS (BCD) device with an operation voltage of about 110 V or other voltage values. The semiconductor device may be other suitable devices other than BCD according to practical requirements.

Figure 20:
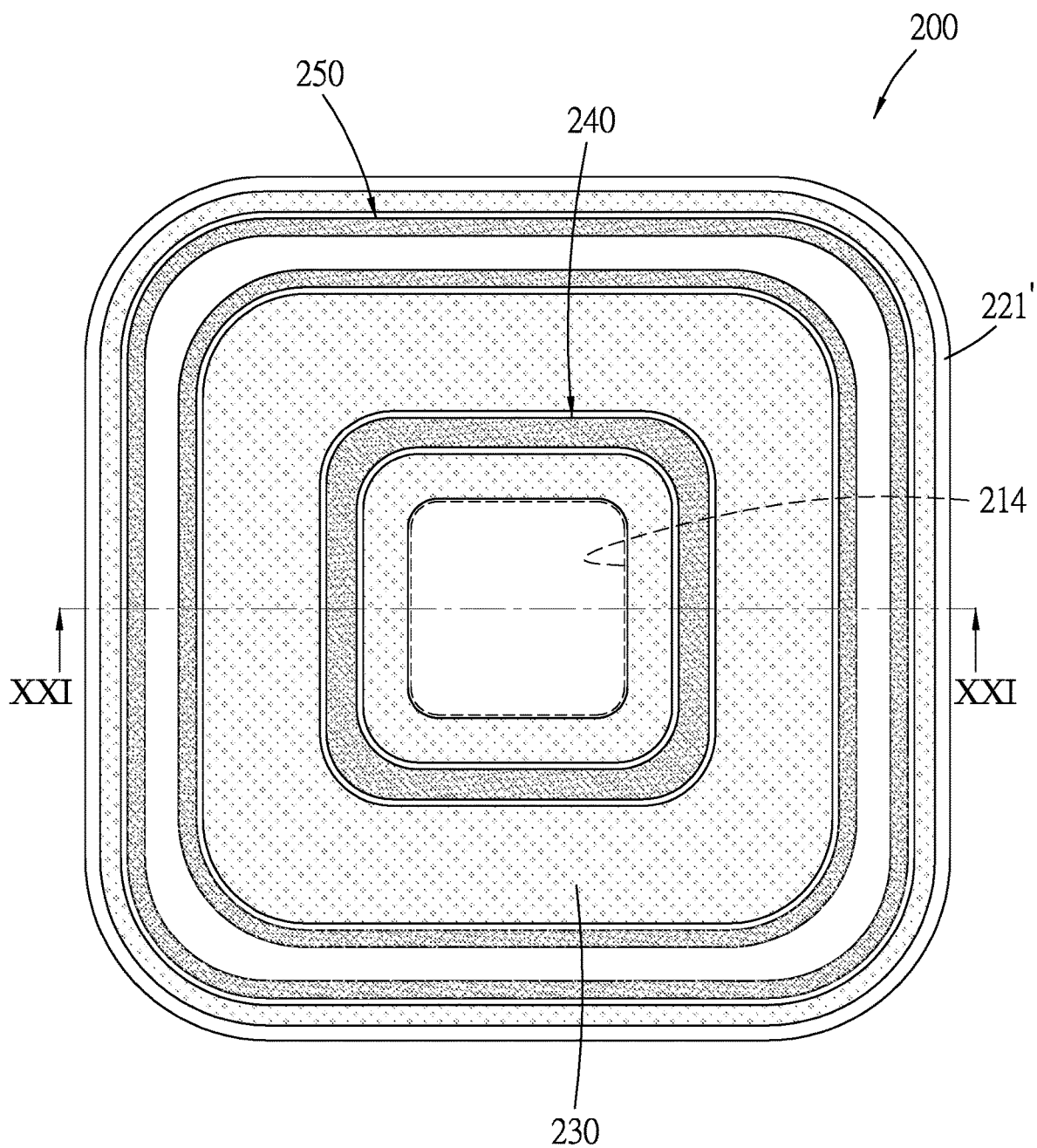
FIG. 20 is another schematic top view of the semiconductor isolation structure in accordance with some embodiments.
Figure 21:
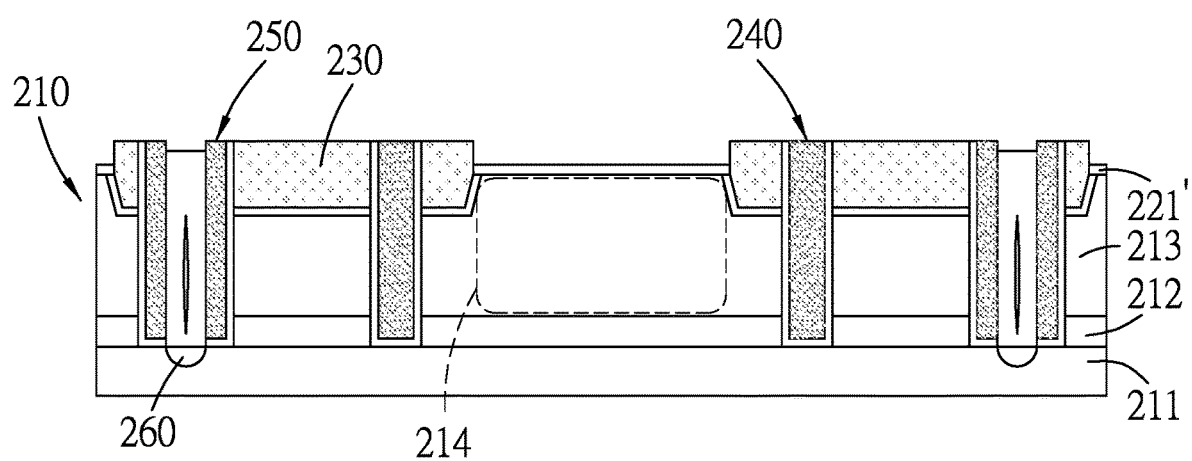
FIG. 21 is a schematic sectional view taken from line XXI-XXI of FIG. 20.

FIG. 20 is a schematic top view of the semiconductor isolation structure 200 in accordance with some embodiments, and FIG. 21 is a schematic sectional view of the semiconductor isolation structure 200 taken from line XXI-XXI of FIG. 20. In the embodiments shown in FIGS. 20 and 21, the shallow trench isolation structure 230 is formed as a single piece without being separated into the first shallow trench isolation 231 and the second shallow trench isolation 232 as shown in FIGS. 18 and 19, and the first deep trench isolation structure 240 and the second deep trench isolation structure 250 both penetrate the shallow trench isolation structure 230.

The method 100 of this disclosure provides the semiconductor isolation structure 200 with the first deep trench isolation structure 240 and the second deep trench isolation structure 250 that can be manufactured simultaneously and that can provide electric insulation to the semiconductor device formed in the functional region 214.

In accordance with some embodiments of the present disclosure, a semiconductor isolation structure includes a silicon-on-insulator wafer, a first deep trench isolation structure and a second deep trench isolation structure. The silicon-on-insulator wafer includes a semiconductor substrate, a buried insulation layer disposed on the semiconductor substrate, and a semiconductor layer disposed on the buried insulation layer. The semiconductor layer has a functional region. The first deep trench isolation structure penetrates the semiconductor layer and the buried insulation layer, and surrounds the functional region. The second deep trench isolation structure penetrates semiconductor layer and the buried insulation layer, and surrounds the first deep trench isolation structure.

In accordance with some embodiments of the present disclosure, the second deep trench isolation structure includes an isolation layer, and a conductive structure that is disposed in and surrounded by the isolation layer and that is connected to the semiconductor substrate.

In accordance with some embodiments of the present disclosure, the first deep trench isolation structure is made of an oxide-based material. The isolation layer of the second deep trench isolation structure is made of an oxide-based material.

In accordance with some embodiments of the present disclosure, the conductive structure of the second deep trench isolation structure is made of polysilicon.

In accordance with some embodiments of the present disclosure, the conductive structure has a seam that is at least 0.1 μm lower than a top surface of the semiconductor layer.

In accordance with some embodiments of the present disclosure, the semiconductor isolation structure further includes a shallow trench isolation structure that is formed in the semiconductor layer and that surrounds the functional region. The first and second deep trench isolation structures further penetrate the shallow trench isolation structure.

In accordance with some embodiments of the present disclosure, the shallow trench isolation structure includes a first shallow trench isolation that surrounds the functional region, and a second shallow trench isolation that surrounds the first shallow trench isolation. The first and second deep trench isolation structures respectively penetrate the first and second shallow trench isolations.

In accordance with some embodiments of the present disclosure, the first and second deep trench isolation structures are separated from each other by a distance ranging from about 1.8 µm to about 2.2 µm.

In accordance with some embodiments of the present disclosure, the first deep trench isolation structure has a lateral width that is smaller than that of the second deep trench isolation structure.

In accordance with some embodiments of the present disclosure, the lateral width of the first deep trench isolation structure ranges from about 0.8 µm to about 1.2 µm. The lateral width of the second deep trench isolation structure ranges from about 1.8 µm to about 2.2 µm.

In accordance with some embodiments of the present disclosure, the second deep trench isolation structure includes an isolation layer, and a conductive structure that is disposed in and surrounded by the isolation layer and that is connected to the semiconductor substrate. The isolation layer includes two isolation segments respectively connected to opposite sides of the conductive structure. Each of the isolation segments of the isolation layer has a lateral width ranging from about 0.6 µm to about 0.8 µm.

In accordance with some embodiments of the present disclosure, a semiconductor isolation structure includes a silicon-on-insulator wafer and concentric first and second deep trench isolation structures. The silicon-on-insulator wafer has a functional region. The concentric first and second deep trench isolation structures are disposed in the silicon-on-insulator wafer, and surround the functional region. The first deep trench isolation structure is surrounded by the second deep trench isolation structure.

In accordance with some embodiments of the present disclosure, the first deep trench isolation structure has a lateral width smaller than that of the second deep trench isolation structure.

In accordance with some embodiments of the present disclosure, the semiconductor isolation structure further includes a shallow trench isolation structure that is formed in the silicon-on-insulator wafer and that surrounds the functional region. The first and second deep trench isolation structures penetrate the shallow trench isolation structure.

In accordance with some embodiments of the present disclosure, a method for making a semiconductor isolation structure includes: forming a silicon-on-insulator wafer including a semiconductor substrate, a buried insulation layer disposed on the semiconductor substrate, and a semiconductor layer disposed on the buried insulation layer and having a functional region; forming a first deep trench and a second deep trench in the silicon-on-insulator wafer, the first deep trench penetrating the semiconductor layer and the buried insulation layer and surrounding the functional region, the second deep trench penetrating the semiconductor layer and the buried insulation layer and surrounding the first deep trench; forming an insulating layer that completely fills the first deep trench and that partially fills the second deep trench; and forming a conductive structure that completely fills the second deep trench.

In accordance with some embodiments of the present disclosure, before the step of forming the first and second deep trenches, a hard mask structure is formed on the silicon-on-insulator wafer. In the step of forming the first and second deep trenches, the first and second deep trenches further penetrate the hard mask structure.

In accordance with some embodiments of the present disclosure, the step of forming the insulating layer includes: conformally forming the insulating layer on a top surface of the hard mask structure and on a trench-defining wall which defines the second deep trench, the trench-defining wall having opposite first and second side portions and a bottom portion; and vertically etching away the insulating layer on the top surface of the hard mask structure and the insulating layer on the bottom portion of the trench-defining wall.

In accordance with some embodiments of the present disclosure, in the vertically etching step, the insulating layer on the first and second side portions of the trench-defining wall is partially etched such that an upper portion of the insulating layer on the first and second side portions of the trench-defining wall has a lateral width smaller than that of a lower portion of the insulating layer on the side portion of the trench-defining wall.

In accordance with some embodiments of the present disclosure, the step of forming the conductive structure includes: forming a conductive layer on the top surface of the hard mask structure and in the second deep trench; and removing the conductive layer on the top surface of the hard mask structure, the insulating layer surrounded by the hard mask structure, the conductive layer surrounded by the hard mask structure, and the hard mask structure.

In accordance with some embodiments of the present disclosure, before the step of forming the first and second deep trenches, a shallow trench isolation structure is formed in the semiconductor layer of the silicon-on-insulator wafer. The shallow trench isolation structure includes a first shallow trench isolation that surrounds the functional region, and a second shallow trench isolation that surrounds the first shallow trench isolation. In the step of forming the first and second deep trenches, the first and second deep trenches respectively penetrate the first and second shallow trench isolations.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor isolation structure comprising:
a silicon-on-insulator substrate including
a semiconductor substrate,
a buried insulation layer disposed on the semiconductor substrate, and
a semiconductor layer disposed on the buried insulation layer, and having a functional region;
a first deep trench isolation structure penetrating the semiconductor layer and the buried insulation layer, and surrounding the functional region;

a second deep trench isolation structure penetrating the semiconductor layer and the buried insulation layer, and surrounding the first deep trench isolation structure; and a shallow trench isolation structure formed in the semiconductor layer and surrounding the functional region, the shallow trench isolation structure including a first shallow trench isolation that surrounds the functional region, and a second shallow trench isolation that surrounds the first shallow trench isolation, the first and second deep trench isolation structures respectively penetrating the first and second shallow trench isolations.

2. The semiconductor isolation structure as claimed in claim 1, wherein the second deep trench isolation structure includes an isolation layer, and a conductive structure that is disposed in and surrounded by the isolation layer and that is connected to the semiconductor substrate.

3. The semiconductor isolation structure as claimed in claim 2, wherein:
the first deep trench isolation structure is made of an oxide-based material; and
the isolation layer of the second deep trench isolation structure is made of an oxide-based material.

4. The semiconductor isolation structure as claimed in claim 3, wherein the conductive structure of the second deep trench isolation structure is made of polysilicon.

5. The semiconductor isolation structure as claimed in claim 2, wherein the conductive structure has a seam that is at least 0.1 μm lower than a top surface of the semiconductor layer.

6. The semiconductor isolation structure as claimed in claim 1, wherein the first and second deep trench isolation structures are separated from each other by a distance ranging from 1.8 μm to 2.2 μm.

7. The semiconductor isolation structure as claimed in claim 1, wherein the first deep trench isolation structure has a lateral width that is smaller than that of the second deep trench isolation structure.

8. The semiconductor isolation structure as claimed in claim 7, wherein:
the lateral width of the first deep trench isolation structure ranges from 0.8 μm to 1.2 μm; and
the lateral width of the second deep trench isolation structure ranges from 1.8 μm to 2.2 μm.

9. The semiconductor isolation structure as claimed in claim 8, wherein:
the second deep trench isolation structure includes an isolation layer, and a conductive structure that is disposed in and surrounded by the isolation layer and that is connected to the semiconductor substrate, the isolation layer including two isolation segments respectively connected to opposite sides of the conductive structure; and
each of the isolation segments of the isolation layer has a lateral width ranging from 0.6 μm to 0.8 μm.

10. A semiconductor isolation structure comprising:
a silicon-on-insulator substrate having a functional region;
concentric first and second deep trench isolation structures that are disposed in the silicon-on-insulator substrate and that surround the functional region, the first deep trench isolation structure being surrounded by the second deep trench isolation structure; and
a shallow trench isolation structure formed in the silicon-on-insulator substrate and surrounding the functional region, the shallow trench isolation structure including a first shallow trench isolation that surrounds the functional region, and a second shallow trench isolation that surrounds the first shallow trench isolation, the first and second deep trench isolation structures respectively penetrating the first and second shallow trench isolations.

11. The semiconductor isolation structure as claimed in claim 10, wherein the first deep trench isolation structure has a lateral width smaller than that of the second deep trench isolation structure.

12. The semiconductor isolation structure as claimed in claim 10, wherein the first deep trench isolation structure includes a dielectric segment and a liner segment that surrounds the dielectric segment, and is separated from the second deep trench isolation structure by a distance ranging from 1.8 μm to 2.2 μm.

13. The semiconductor isolation structure as claimed in claim 10, wherein the second deep trench isolation structure includes an isolation layer, and a conductive structure that is disposed in and surrounded by the isolation layer and that is connected to the semiconductor substrate.

14. The semiconductor isolation structure as claimed in claim 13, wherein
the first deep trench isolation structure is made of an oxide-based material; and
the isolation layer of the second deep trench isolation structure is made of an oxide-based material.

15. A semiconductor isolation structure comprising:
a semiconductor substrate;
a buried insulation layer disposed on the semiconductor substrate;
a semiconductor layer disposed on the buried insulation layer opposite to the semiconductor substrate, and having a functional region;
first and second deep trench isolation structures that penetrate the semiconductor layer and the buried insulation layer so as to be in contact with the semiconductor substrate and that surround the functional region, the first deep trench isolation structure being proximate to and surrounding the functional region, the second deep trench isolation structure being distal from the functional region and surrounding the first deep trench isolation structure; and
a shallow trench isolation structure formed in the semiconductor layer and surrounding the functional region, the shallow trench isolation structure including a first shallow trench isolation that surrounds the functional region, and a second shallow trench isolation that surrounds the first shallow trench isolation, the first and second deep trench isolation structures respectively penetrating the first and second shallow trench isolations.

16. The semiconductor isolation structure as claimed in claim 15, wherein the first deep trench isolation structure includes a dielectric segment and a liner segment that surrounds the dielectric segment, and is separated from the second deep trench isolation structure by a distance ranging from 1.8 μm to 2.2 μm.

17. The semiconductor isolation structure as claimed in claim 15, wherein the second deep trench isolation structure includes an isolation layer, and a conductive structure that is disposed in and surrounded by the isolation layer and that is connected to the semiconductor substrate.

18. The semiconductor isolation structure as claimed in claim 15, wherein the first deep trench isolation structure has a lateral width that is smaller than that of the second deep trench isolation structure.

19. The semiconductor isolation structure as claimed in claim 18, wherein:
  the lateral width of the first deep trench isolation structure ranges from 0.8 μm to 1.2 μm; and
  the lateral width of the second deep trench isolation structure ranges from 1.8 μm to 2.2 μm.

20. The semiconductor isolation structure as claimed in claim 15, wherein the first and second deep trench isolation structures are arranged in a concentric manner.

* * * * *